United States Patent [19]

Soiferman

[11] Patent Number: 5,517,110

[45] Date of Patent: May 14, 1996

[54] CONTACTLESS TEST METHOD AND SYSTEM FOR TESTING PRINTED CIRCUIT BOARDS

[75] Inventor: Jacob Soiferman, Winnipeg, Canada

[73] Assignee: Yentec Inc., Winnipeg, Canada

[21] Appl. No.: 417,900

[22] Filed: Apr. 6, 1995

[51] Int. Cl.[6] ........................... G01R 31/02; H01H 31/04
[52] U.S. Cl. ..................... 324/158.1; 324/538; 324/639
[58] Field of Search ................................ 324/158.1, 750, 324/439, 519, 501, 537, 538, 639, 642, 655, 675, 95; 340/600; 343/703

[56] References Cited

U.S. PATENT DOCUMENTS

| | | | |
|---|---|---|---|
| 4,583,042 | 4/1986 | Riemer | 324/519 |
| 4,805,627 | 2/1989 | Klingenbeck et al. | 324/639 |
| 4,829,238 | 5/1989 | Goulette et al. | 324/750 |
| 5,006,788 | 4/1991 | Goulette et al. | 324/501 |
| 5,124,660 | 6/1992 | Cilingiroglu | 324/538 |
| 5,218,294 | 6/1993 | Soiferman | 324/158.1 |

Primary Examiner—Ernest F. Karlsen
Attorney, Agent, or Firm—Adrian D. Battison; Murray E. Thrift

[57] ABSTRACT

A method and apparatus are disclosed for testing unpopulated and inactive populated printed circuit boards for manufacturing defects. The method and apparatus do not require electrical contact with the board under test. The method and apparatus include an AC source, which is connected to the stimulator(s). The stimulator(s) radiate an electromagnetic field onto the traces and components on the board under test and this interaction establishes a potential gradient along the traces and components. A sensor array is located adjacent to a stimulator (if only one is used) or between a pair of stimulators (if a dual arrangement is used) and detects the displacement currents flowing from the board under test. The sensors and stimulator(s) do not electrically connect to the board under test, which is positioned between a ground reference plane and a sensor/stimulator unit. By scanning across the entire surface of the board under test, a displacement current signature of the board under test is obtained. Manufacturing defects on the board under test are found by computer analysis of the displacement current signature.

19 Claims, 4 Drawing Sheets

CONTACTLESS TEST METHOD AND SYSTEM FOR TESTING PRINTED CIRCUIT BOARDS

FIELD OF THE INVENTION

This application relates generally to electronic test equipment and more specifically to equipment for testing inactive populated and unpopulated printed circuit boards for manufacturing defects, without electrical contact to the board under test.

BACKGROUND OF THE INVENTION

During the manufacture and subsequent handling of printed circuit boards, defects such as unwanted open circuits or short circuits may develop in or between circuit pathways and electronic components. Manufacturers continually look for faster, more accurate and more economical ways to find defects. It is necessary and cost effective to perform automated testing of both populated and unpopulated printed circuit boards for manufacturing quality control.

Testing of printed circuit boards is becoming increasingly difficult and more expensive as the use of surface mount technology increases and as integrated circuits and printed circuit boards become more complex and operate at higher frequencies. Conventional techniques for automated printed circuit board testing involve applying signals through a set of test pins and measuring output signals on other test pins. "Functional testing" can be performed by energizing the printed circuit board, applying a predetermined set of input signals, and determining whether the proper output signals are generated by the circuitry on the board being tested. Alternatively, a printed circuit board may be tested on a "bed-of-nails" tester that comprises pins which directly contact the metallic traces on the printed circuit board being tested so that selected input signals may be applied at various nodes on the printed circuit board, and corresponding output signals can be measured to other nodes on the printed circuit board. Conventional bed-of-nails testing requires that the functionality of the circuits mounted on the board under test be known, so that test routines can be written to isolate the circuitry of interest, to apply input signals to the appropriate nodes, and to generate expected output signals to be received from other nodes.

Non-contact probes have been used for measurements on high frequency microwave circuits. However, at frequencies below 1 GHz, the test is difficult due to the high bandwidth of the probes. Most recent advances of the test equipment industry have resulted in devices for the evaluation of electromagnetic compatibility (EMC) of PCB assemblies. However, these devices, in their present forms, provide only information about electromagnetic interference caused by active populated boards, and can not be used for providing detailed information about the performance of the board. The present invention is targeted at testing for manufacturing faults of unpopulated boards and inactive populated boards.

One printed circuit board testing method is described in U.S. Pat. No. 5,218,294, issued Jun. 8, 1993 to Soiferman. The technique taught away from using a bed-of-nails tester. The patent disclosed stimulating a printed circuit board through the power and ground lines of the board with an AC signal and then contactlessly measuring the electromagnetic near field distribution proximate the board being tested. The electromagnetic "signature" of the board being tested was compared to the electromagnetic signature of a known good circuit board to determine whether the board under test was defective.

U.S. Pat. No. 4,829,238, issued May. 9, 1989 to Goulette, et al., discloses monitoring electromagnetic emissions from a printed circuit board by energizing the board while it is located adjacent an array of electromagnetic emission measuring probes. A division from that application, U.S. Pat. No. 5,006,788, issued to Goulette, et al. on Apr. 9, 1991. The Goulette patents are directed toward measuring radiating electromagnetic emissions from a circuit board, primarily for the purpose of eliminating or monitoring electromagnetic interference generated by a circuit board or the components thereon. Goulette's approach is not directed toward testing a printed circuit board for manufacturing defects which do not result in interfering levels of electromagnetic radiation. There are numerous other patents, as cited in the Goulette patents, which are directed toward testing printed circuit boards for undesirable radiating emissions.

One alternative printed circuit board testing method is described in U.S. Pat. No. 4,583,042, issued Apr. 15, 1986 to Riemer. That patent disclosed a circuit board test system for measuring the electrical continuity and integrity of line segments. The system consists of a capacitance meter with a pair of sensory terminals, one of which is coupled to a conductive elastomeric backside reference plane and the other is coupled to a test probe. The test probe is a single shielded one-point probe. The sensors measure voltage levels and from the voltage drop between the sensors, the line segment capacitance is determined. The test probe sensor moves relative to the test board for sequentially contacting all of the test points on the printed circuit board.

A deficiency with the Riemer system is the required electrical contact between the test probe and the printed circuit board under test. Another deficiency in the system is the dependence on the board layout, because the location of the test points must be determined prior to probing. Furthermore, it is critical for accurate measurements that the interface between the test board and reference plane be devoid of air gaps.

Another printed circuit board test system is disclosed in U.S. Pat. No. 5,124,660, issued Jun. 23, 1992 to Cilingiroglu. This patent discloses a system that determines whether input and output pins of semiconductor components are present and properly soldered to a printed circuit board. The system includes an oscillator which is connected to a metallic electrode placed on top of an integrated circuit package. A probe pin in a bed-of-nails tester is connected to a printed circuit board wiring trace that is soldered to the pin being tested. The oscillator signal is capacitively coupled through the integrated circuit package to the pin being tested, so if current is measured by the current measuring device, the pin is connected to the printed circuit board.

A deficiency with the Cilingiroglu system is the direct contact required between the bed-of-nails and the board under test. Another deficiency is the test is dependent on the board layout, because the location of the bed-of-nails test points must be determined. Furthermore, it only tests the connection between the pin of a component and the printed circuit board node.

Thus, there is a need in the art for a device and method that will detect manufacturing faults on unpopulated or inactive populated printed circuit boards. Inactive refers to the fact the printed circuit board is not powered up. Furthermore, there is a need for a device in the art that does not require functional test vectors, and that does not require isolating adjacent components on the printed circuit board for test purposes. There is a further requirement in the art that the printed circuit board being tested is not functioning or energized in an unique state during the test procedure. There is still a further need in the art for a "contactless test system", or a system with simple fixturing in which direct electrical contact between sensors or sources and the board under test is not required and the printed circuit board is tested independent of its structure and functionality.

SUMMARY OF THE INVENTION

The present invention provides solutions to a number of deficiencies in the prior art. It provides an accurate method for detecting manufacturing defects on unpopulated or inactive populated printed circuit boards (hereinafter both referred to as "PC Boards"). The method uses electromagnetic fields for signal application and noncontact sensors for signal detection and thus does not require electrical contact with the PC Boards under test. It provides a tester that does not require functional test vectors, isolation of adjacent components, unique energizing states or direct electrical connection to the PC Board under test (hereinafter referred to as "BUT").

The foregoing benefits and others are provided by a tester having, in preferred embodiments, an AC signal generator, a sensor/stimulator unit (consisting of stimulator(s) for radiating an electromagnetic field onto the BUT and an array of sensors, and isolation between the stimulator and sensor by ground plane shielding), a top side spacing separating the sensor/stimulator unit from the BUT, a BUT positioning mechanism and a bottom side spacing separating the BUT from the bottom side ground plane reference. The tester includes a movement mechanism for scanning purposes. Furthermore, the tester incorporates computer analysis of the sensor signal pickup to determine if the BUT is faulty.

According to one embodiment of the invention a single stimulator and a ground reference constitute the means for establishing an electric field gradient along the traces and components on the BUT.

According to another embodiment of the invention, a dual stimulator arrangement of front and back stimulators are provided with an AC signal equal in amplitude and 180 degrees out of phase with respect to each other, in order to establish an electric field potential gradient along traces and components on the BUT.

According to another embodiment of the invention, a dual stimulator arrangement of front and back stimulators are provided with the same signal in both amplitude and phase, in order to establish an uniform electric field potential along traces and components on the BUT.

According to another embodiment of the invention, the bottom side ground reference plane is short circuited to one side of the BUT, for unpopulated single-sided or inner-layer BUT testing.

According to another embodiment of the invention, a bottom side spacing is utilized to separated the BUT from the ground reference plane, which permits the testing of multi-layer PC Boards.

In operation, an AC source provides a signal to the stimulator(s), which in turn radiate an electromagnetic field onto the BUT. The sensors pick up the displacement currents from the conductive traces and components on the BUT. The electronics utilize a transimpedance amplifier (a high bandwidth amplifier), to generate a low impedance at the sensors to provide: good isolation between adjacent sensors, means for generating an electric field gradient, high signal-to-noise ratio and means to detect displacement current flowing between the sensors and traces and components on the BUT. Furthermore, the electronics utilizes a transimpedance amplifier in conjunction with a multiplexer to improve performance of the design by reducing the interference between channels.

By scanning across the entire surface of the BUT, a displacement current signature of the BUT is obtained. Manufacturing faults can be detected with the aid of computer analysis. A fault recognition system compares the pattern of the BUT with a known or desired pattern of an identical, non-faulty board. Such comparisons result in a measure of the difference between the non-faulty and faulty boards. If the difference is larger than a pre-determined threshold the BUT is diagnosed to be faulty, or out of tolerance. If the difference is smaller than the threshold, the BUT is diagnosed to be non-faulty. Statistical analysis can further result in more detailed information of faults found, such as location, type, etc. The so called "known pattern" of the non-faulty board can be obtained either by scanning a non-faulty board in the same way as scanning the BUT, or by theoretical calculation according to the design specifications. The design specifications are easily obtained from computer aided design tools that are used to create printed circuit board layouts.

BRIEF DESCRIPTION OF THE DRAWINGS

The advantages and other characteristics of the invention will be better understood by reading the detailed description of the invention to follow, in conjunction with the attached drawings, wherein.

It should be noted that the drawings are not intended to limit the scope of the invention. The invention will herein be described in detail, and it should be understood that the invention covers all modifications, alternatives and equivalents falling within the scope of the invention given by the claims.

DESCRIPTION OF THE PREFERRED EMBODIMENT

Figure 1:
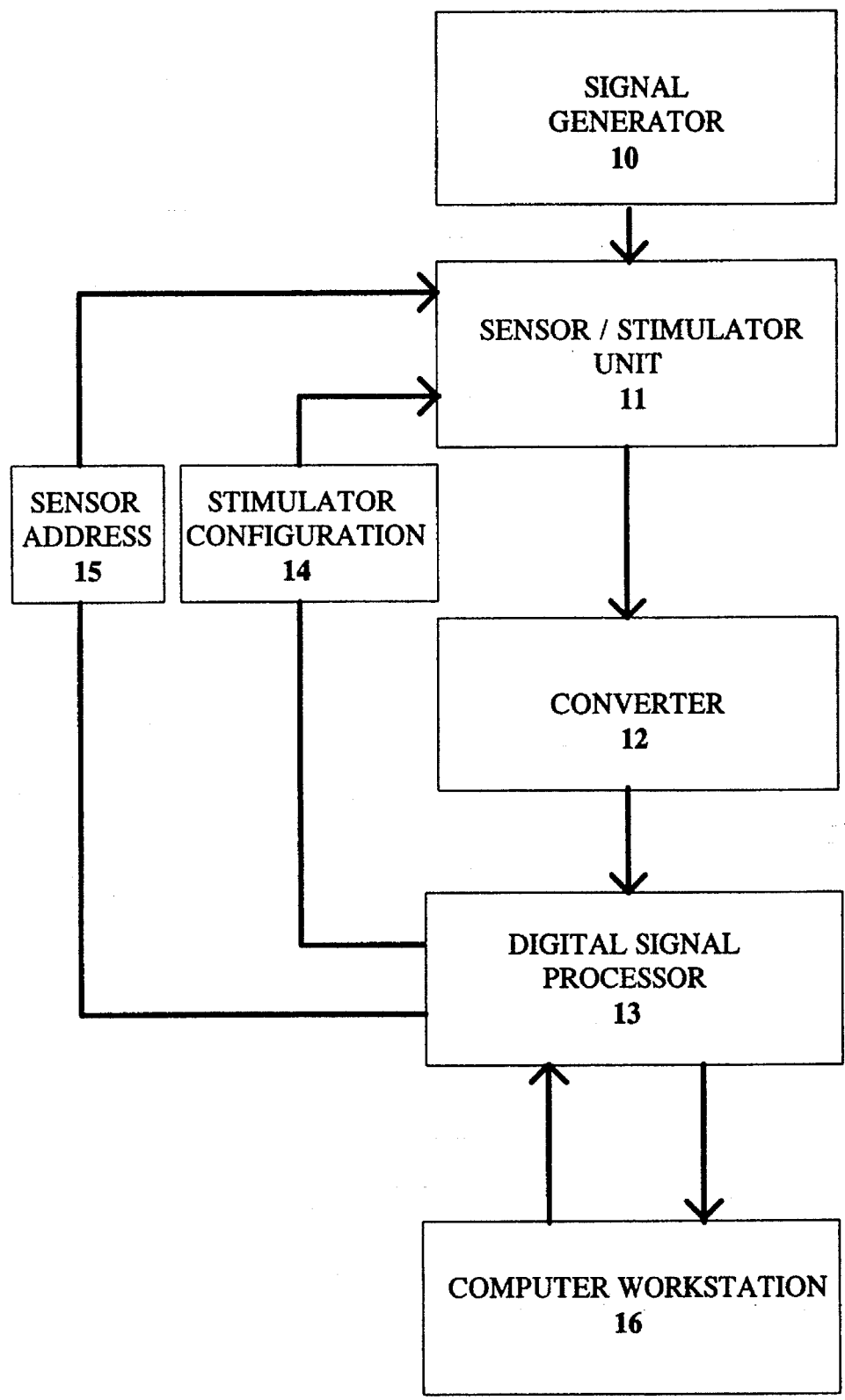
FIG. 1 is a simplified block diagram depicting the hardware architecture of the Contactless Test System.

FIG. 1 depicts the hardware architecture of the Contactless Test System (hereinafter referred to as "CTS"). The signal generator 10 provides the stimulator(s) with a continuous AC sinusoidal signal. The sensors on the sensor/stimulator unit 11 are continuously sensing the magnitude of the displacement current from the traces and components on the BUT. The analog signal detected is digitized by the analog to digital converter 12 (A/D converter). A digital signal processor 13 (DSP) accepts the digital data and is utilized to detect the peak value of the displacement current. The DSP 13 passes the peak value to the computer workstation 16 for analysis. The DSP 13 also initializes the stimulator configuration 14 to obtain the required electromagnetic radiation from the sensor/stimulator unit 11. Furthermore, the DSP 13 sets the sensor address 15 in the prescribed order, allowing the required analog data to be sent to the A/D converter 12. The computer workstation 16 passes instructions to the DSP 13 and receives peak values of the displacement current from the DSP 13 for analysis and fault determination.

Figure 2:
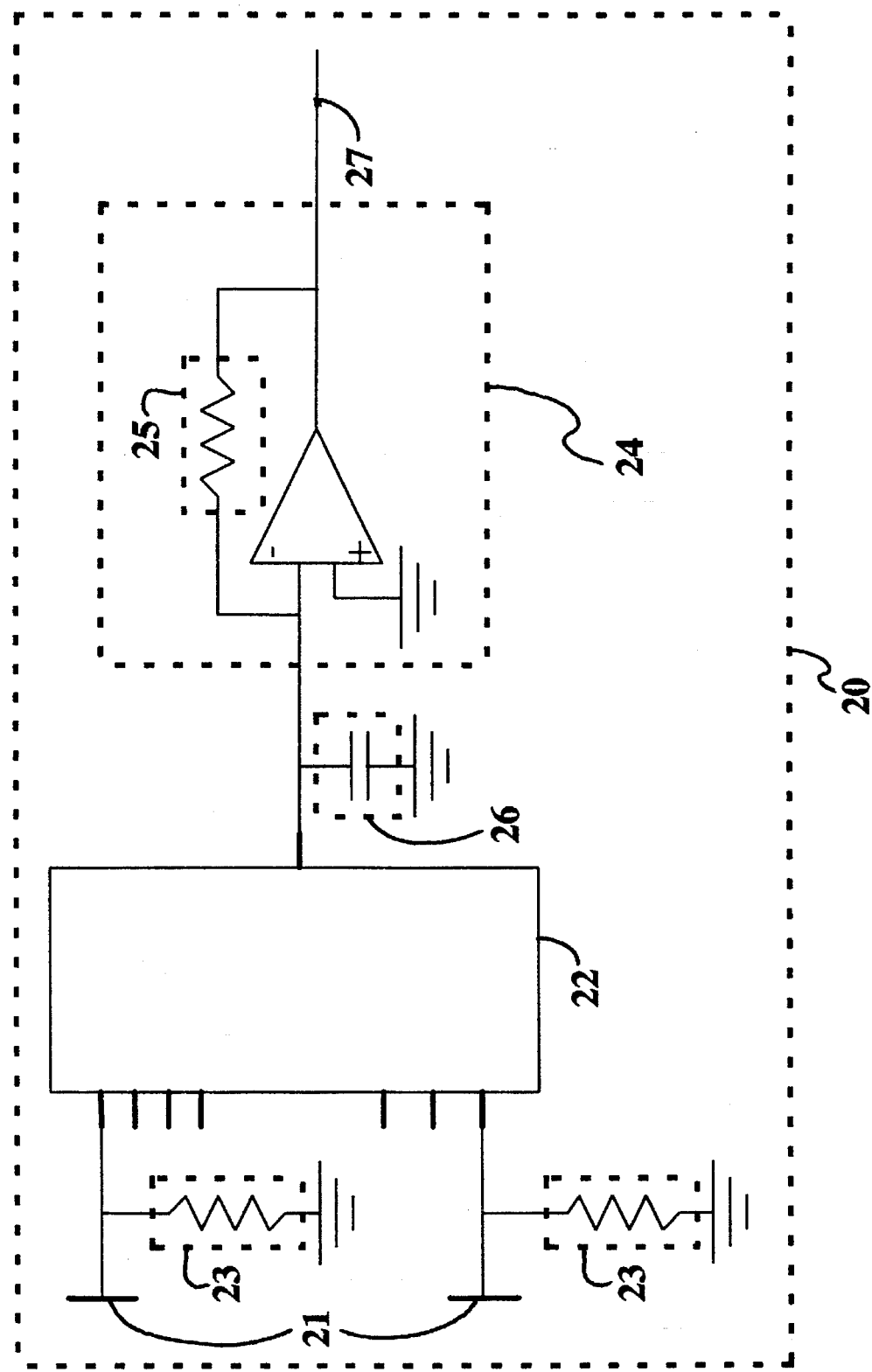
FIG. 2 is a block diagram depicting the sensor interface electronics utilized for processing of signals detected at the sensors.

FIG. 2 is a block diagram depiction of the sensor interface electronics 20 used to process the signal pickup at the sensor(s) 21. The sensor interface electronics 20 are part of the sensor/stimulator unit depicted in FIG. 1. The sensor(s) 21 are connected to the input channels of a multiplexer 22. An input resistor 23 is also connected to the multiplexer 22 input and the sensor(s) 21. The input resistor 23 provides low impedance to prevent capacitive coupling between adjacent sensors 21. A transimpedance amplifier 24 is connected to the output of the multiplexer 22. The output 27 of the transimpedance amplifier 24 is digitized by an analog-to-digital converter FIG. 1(12) for signal processing. The transimpedance amplifier 24 is a high bandwidth amplifier, which is required to obtain low input impedance. A low enough input impedance permits the displacement current to flow in the feedback resistor 25, rather than in the shunt capacitance 26 or the input resistor 23. The shunt capacitance 26, which appears at the multiplexer 22 output, is a consequence of the multiplexer 22 internal circuitry (not shown). The arrangement of the sensor interface electronics 20 as depicted in FIG. 2, reduces complexity since less amplifiers are required. Furthermore, the arrangement improves performance because lower interchannel interference results by connecting the transimpedance amplifier 24 to the output of the multiplexer 22 and higher signal-to-noise ratio is obtained. The high signal-to-noise ratio is obtained because the noise is proportional to the square root of the feedback resistor 25 ($\sqrt{R}$) and the signal is proportional to the feedback resistor 25 (R).

Figure 3:
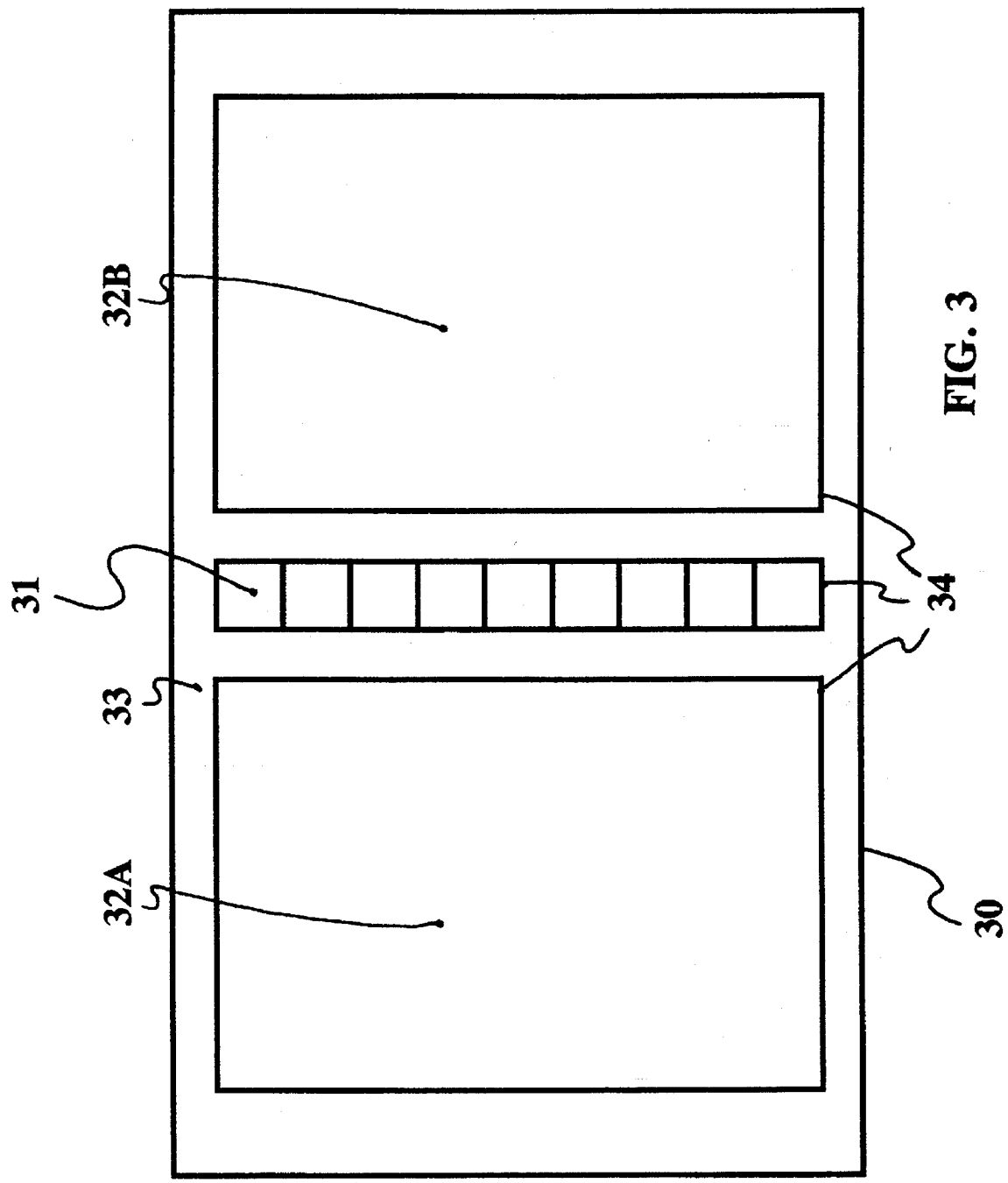
FIG. 3 is a view of the sensor/stimulator unit face, depicting the location of sensors with respect to the stimulators.

Referring to FIG. 3, the sensor/stimulator unit face 30 is shown. This depiction clarifies the arrangement of sensors 31 and the stimulators 32A and 32B. Furthermore, it clarifies the location of the ground shielding 33 and the insulation lines 34. It should be noted that in one arrangement of the CTS system the electronics on the backside of the sensor/stimulator unit FIG. 1(11) includes the A/D converter FIG. 1(12) and the DSP FIG. 1(13) along with the electronics required for the sensors 31 as depicted in FIG. 2.

Figure 4:
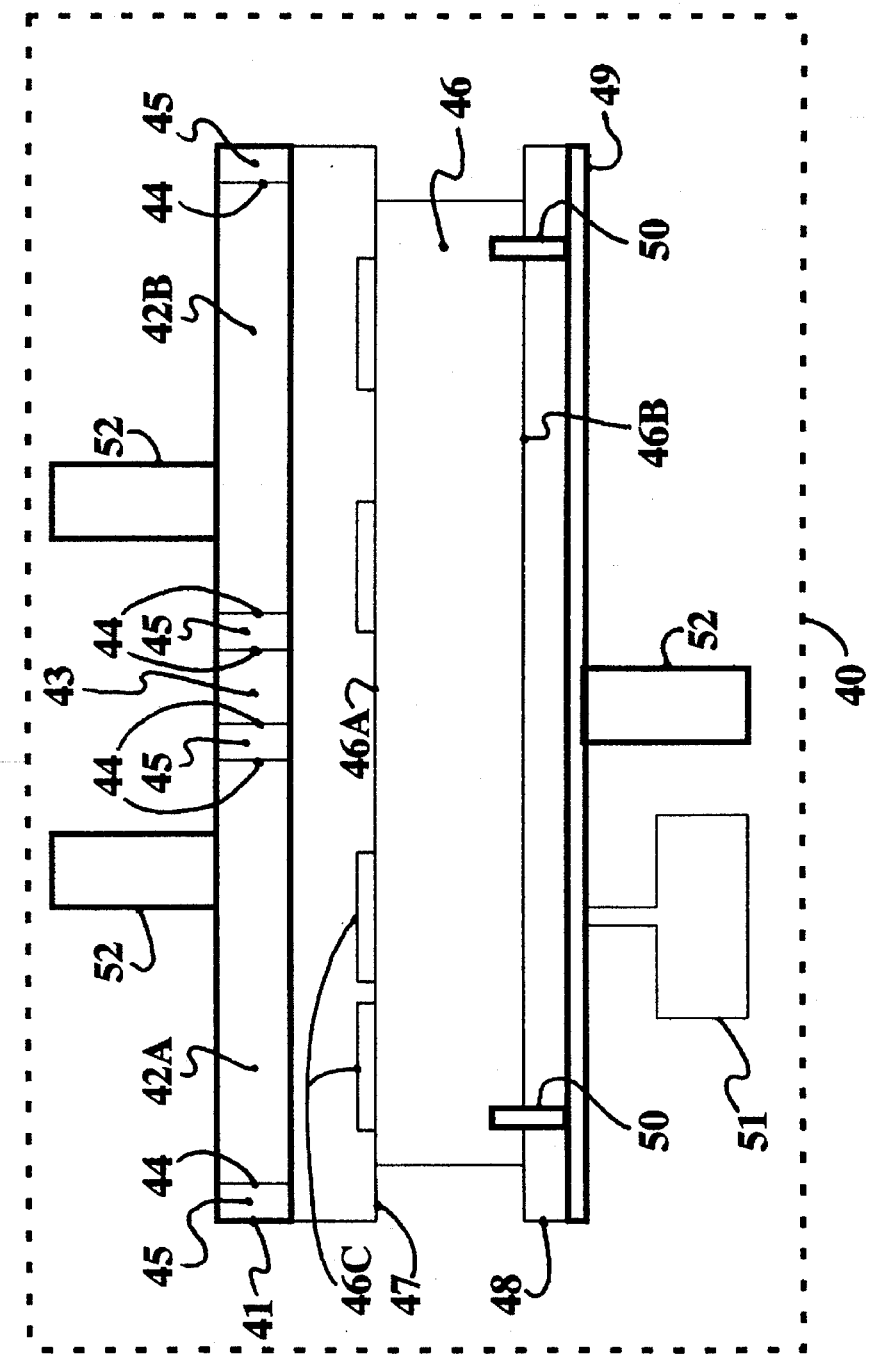
FIG.4 is a simplified cross-sectional view of the Contactless Test System setup.

FIG. 4 shows a simplified cross-sectional view of the CTS setup 40. The invention includes a sensor/stimulator unit 41, whose face FIG. 3 comprises of a front stimulator 42A, a back stimulator 42B, sensors 43, insulation lines 44 and ground shielding 45. An AC sinusoidal signal is provided to each stimulator 42A and 42B by a signal generator FIG. 1(10). The applied signal for an unpopulated BUT 46 configuration has a frequency in the range from 10 KHz to 1 MHz and for an inactive populated BUT 46 has a frequency in the range from 1 MHz to 20 MHz. The stimulators 42A and 42B in turn radiate an electromagnetic field, which travels through the topside spacing 47 onto the BUT 46. The electromagnetic field interacts with the BUT 46 inducing currents and charges onto its traces and components 46C, which creates a potential gradient along the traces and components. The BUT has a first side 46A adjacent the stimulators and an opposed side 46B. The sensors 43 will sense the displacement current magnitude from the traces and components. With one scan across the entire BUT 46, a unique signature of the displacement current distribution is constructed. Movement 52 is required for scanning the But 46, either the sensor/stimulator unit 41 moves and the BUT 46 is stationary, or vice versa. Manufacturing faults are detected by analyzing the displacement current distribution with a computer workstation FIG. 1(16) The interaction of the electromagnetic field and the BUT 46 depends on the arrangement of the bottom side spacing 48 and the ground reference plane 49 location. If only one side of a PC board is to be tested, no bottom side spacing 48 is required and the BUT 46 is positioned on top of the ground reference plane 49. In this arrangement, the sensors 43 detect the magnitude of displacement currents induced on only one side of the BUT 46. In this form of the invention, the electromagnetic interaction between the stimulators 42A and 42B and the BUT 46 is simplified. When testing a BUT 46 in its entirety with a single scan, a bottom side spacing 48 is required to permit an electromagnetic interaction with all components and traces on the BUT 46. The ground plane reference 49 is located further from the BUT 46 and thus the electromagnetic interaction becomes more complicated. In either case, the sensors 43 sense the displacement current amplitude from the BUT 46. The sensors 43 are isolated from the stimulators 42A and 42B by insulation lines 44 and by ground shielding 45. Furthermore, the sensors are isolated from one another by insulation lines 44, which are shown in FIG. 3. The topside spacing 47 and the bottom side spacing 48 can be air gaps, dielectric moldings or a combination depending on the type of BUT 46 and the test configuration. The dielectric material concentrates electric fields. The BUT 46 is positioned using positioning pins 50 and a vacuum pump 51.

Having described presently preferred embodiments of the invention, a person skilled in the art would recognize that various alternative embodiments could be constructed within the scope of the invention. For example, various changes may be made in the shape, size and arrangement of pans. Thus, the illustrations do not impose any limits upon the scope of the invention, as their purpose is to teach those skilled in the art the manner of carrying out the invention.

What is claimed is:

1. A method for testing an unpopulated or inactive populated printed circuit board (BUT)including electrically conductive paths, parts and surfaces whose electrical and physical continuity and conformance to a known standard is to be verified, the BUT having a first side and an opposite side, the method comprising the steps of:

a) providing electromagnetic signal applying means without electrical contact with said BUT, wherein said electromagnetic signal applying means comprises at least one stimulator located adjacent to said BUT on said one side thereof;

(b) providing power to said electromagnetic signal applying means with an AC signal generator such that said stimulator radiates an electromagnetic field onto said BUT, which induces currents and charges on said electrically conductive paths, parts and surfaces of said BUT which establishes an electromagnetic potential along said electrically conductive paths, parts and surfaces;

(c) providing ground reference plane means on said opposite side of said BUT with respect to said at least one stimulator, wherein said ground reference plane means attracts the electromagnetic field from the stimulator means to pass through and interact with said BUT;

d) providing sensor detection means without electrical contact with said BUT wherein said sensor detection means detect said currents and charges induced on said electrically conductive paths, parts and surfaces, wherein said sensor detection means provide an output signal representative of the detected currents and charges, and wherein said sensor detection means is located adjacent to said at least one stimulator on said one side of said BUT and isolated from said at least one stimulator by insulation means;

(e) providing positioning fixturing and movement means for said electromagnetic signal applying means, said sensor detection means and said BUT, wherein there is provided relative movement with respect to said BUT of said sensor detection means and said at least one stimulator for scanning said BUT to generate a series of the output signals which relates to at least a part of the BUT;

(f) providing computer analysis of said series of output signals from said sensor detection means to detect defects in said BUT.

2. The method in claim 1 wherein said electromagnetic signal applying means comprises two stimulators.

3. The method in claim 1 wherein said sensor detection means comprises an array of sensors.

4. The method in claim 3 wherein said sensors are patch sensors.

5. The method in claim 1 wherein said electromagnetic signal applying means comprises two stimulators, wherein said sensor detection means comprises an array of sensors and wherein said sensor array is located between said two stimulators.

6. The method in claim 1 wherein said insulation means comprises ground shielding.

7. The method in claim 1 wherein said positioning and fixturing means comprises positioning pins and a vacuum source for engaging and holding said BUT.

8. The method in claim 1 including two stimulators wherein each of said stimulators comprises a respective one of two metallic plates each radiating an electric field onto said BUT electrically conductive paths, parts and surfaces and wherein said AC signal generator is arranged such that said radiated fields are out of phase with respect to each other.

9. The method in claim 1 wherein the electromagnetic signal applying means and the sensor detection means are mounted together to form a single unit.

10. The method in claim 1 wherein said sensor detection means comprises an array of sensors and wherein said computer analysis comprises receiving the output signal from each sensor of the array and measuring the peak value of the output signal, converting the analog peak value to a digital form signal and transferring the digital form signal to a central computer workstation, wherein the computer workstation includes software to diagnose faults on the BUT based on the digital form signals from the array of sensors.

11. The method in claim 1 wherein said sensor detection means comprises an array of sensors and wherein a transimpedance amplifier with input multiplexer is used to generate low impedance at the sensors.

12. Apparatus for testing an unpopulated or inactive populated printed circuit board (BUT) including electrically conductive paths, parts and surfaces whose electrical and physical continuity and conformance to a known standard is to be verified, the BUT having a first side and an opposite side, the apparatus comprising:

(a) electromagnetic signal applying means for applying a signal to the BUT without electrical contact with said BUT, wherein said electromagnetic signal applying means comprises at least one stimulator;

(b) an AC signal generator for providing power to said electromagnetic signal applying means such that said stimulator radiates an electromagnetic field onto said BUT;

(c) means for mounting the electromagnetic signal applying means on said first side of the BUT;

(d) ground reference plane means and means for mounting the ground reference plane means on said opposite side of said BUT wherein said ground reference plane means is arranged opposite to said at least one stimulator to attract the electromagnetic field from the stimulator to pass through and interact with said BUT;

(e) sensor detection means for detecting currents and charges induced on said electrically conductive paths, parts and surfaces of the BUT without electrical contact with said BUT and for generating an output signal representative of the detected currents and charges, means mounting said sensor detection means adjacent to said at least one stimulator on said one side of said BUT and insulation means for isolating said sensor detection means from said at least one stimulator;

(f) positioning fixturing and movement means for said electromagnetic signal applying means, said sensor detection means and said BUT and for providing relative movement with respect to said BUT of said sensor detection means and said at least one stimulator for scanning said BUT to generate a series of the output signals which relates to at least a part of the BUT;

(g) and computer analysis means for receiving said series of output signals from said sensor detection means and for analyzing said series of signals to detect defects in said BUT.

13. The apparatus in claim 12 wherein said electromagnetic signal applying means comprises two stimulators.

14. The apparatus in claim 12 wherein said sensor detection means comprises an array of patch sensors.

15. The apparatus in claim 12 wherein said electromagnetic signal applying means comprises two stimulators, wherein said sensor detection means comprises an array of sensors and wherein said sensor array is located between said two stimulators.

16. The apparatus in claim 12 wherein said insulation means comprises ground shielding.

17. The method in claim 12 wherein said positioning and fixturing means comprises positioning pins and a vacuum source for engaging and holding said BUT.

18. The apparatus in claim 12 wherein the electromagnetic signal applying means and the sensor detection means are mounted together to form a single unit.

19. The apparatus in claim 12 wherein said sensor detection means comprises an array of sensors and wherein a transimpedance amplifier with an input multiplexer is used to generate low impedance at the sensors.

* * * * *